US005579211A

United States Patent [19]

Hendel

[11] Patent Number: 5,579,211

[45] Date of Patent: Nov. 26, 1996

[54] RELAY WITH A PLUG ADAPTOR SYSTEM AND METHOD FOR MANUFACTURING SAME

[75] Inventor: Horst Hendel, Berlin, Germany

[73] Assignee: Siemens Aktiengesellschaft, Munich, Germany

[21] Appl. No.: 546,673

[22] Filed: Oct. 23, 1995

[30] Foreign Application Priority Data

Oct. 24, 1994 [DE] Germany .......................... 44 37 954.4

[51] Int. Cl.[6] .......................... H05K 7/00

[52] U.S. Cl. .......................... 361/819; 361/729; 361/796

[58] Field of Search .......................... 361/752, 796, 361/819, 818, 728, 729, 730; 29/842, 843, 844; 335/199; 439/271; 174/50

[56] References Cited

U.S. PATENT DOCUMENTS

| | | | |
|---|---|---|---|
| 3,714,515 | 1/1973 | Lee | 317/118 |
| 3,809,965 | 5/1974 | Groth et al. | 317/113 |
| 3,949,276 | 4/1976 | Reuting | 317/113 |
| 4,361,371 | 11/1982 | Williams | 339/17 R |
| 4,400,761 | 8/1983 | Hayden et al. | |

FOREIGN PATENT DOCUMENTS

| | | |
|---|---|---|
| 2618317 | 11/1977 | Germany . |
| 2810511 | 6/1984 | Germany . |

*Primary Examiner*—Leo P. Picard
*Assistant Examiner*—Y. Whang
*Attorney, Agent, or Firm*—Hill, Steadman & Simpson

[57] ABSTRACT

A relay (1), particularly a relay with solder terminal pins (13) connected onto a plug adaptor that is formed by a base (20) of insulating material with male plug elements for plugging the adaptor and relay into a circuit. The adaptor has a male connector member with a plurality of conductor elements embedded or inserted into the base and a plurality of high-current blades bent respectively off from the conductor elements. After soldering of the terminal pins (13) to the conductor segments (25), the base region surrounded by a circumferential wall (22) is filled with casting compound. As a result thereof, the arrangement is sealed on all sides and the adaptor with the blade is stabilized and strengthened, so that it can withstand high plugging forces.

22 Claims, 4 Drawing Sheets

RELAY WITH A PLUG ADAPTOR SYSTEM AND METHOD FOR MANUFACTURING SAME

BACKGROUND OF THE INVENTION

The present invention is directed to a relay plug adaptor arrangement including a relay with terminal pins projecting from a lower side and with a plug adaptor connectable to the relay. More particularly, the adaptor comprises an insulating base or pedestal in which conductor segments of a pressed male plug connector member are secured in a plane parallel to the lower side of the relay. The conductor segments respectively form contact recesses for receiving the relay terminal pins with a non-positive fit contacting, particularly solder contacting. The male plug connector member also forms terminal lugs or blades bent off of one piece perpendicular to the conductor segments. The invention is also directed to a method for the manufacture of such an arrangement.

The terminal elements of relays are designed in accordance with a particular utilization. Usually, relay terminal elements are configured either as solder pins for direct soldering of the relay into a printed circuit board or as flat plugs for plug contacting in a plug socket. Plug sockets are known which have solder pins that are soldered into a printed circuit board and which include plug jacks for receiving a pluggable relay.

German patent document DE 28 10 511 C2 discloses an adaptor for converting a terminal grid of a relay into a different grid of a printed circuit board. An arrangement is shown therein in which the conductor segments are made of thin spring steel, forming spring sockets that enable a plug contacting of the relay in the adaptor without soldering. A soldered connection is also disclosed, however, the terminal lugs of the adaptor itself are in turn suitable only as solder pins and not for plugging due to the small cross section of the material.

Thus, for relays originally designed for utilization on printed circuit boards with solder terminals, it is desirable to make such relays pluggable as well for various utilizations, particularly for employment in motor vehicles, in order to be able to use them in boxes with plug-in sockets together with other pluggable components and relays. For such applications, U.S. Pat. No. 4,400,761 discloses that relays, and possibly with other components, may be accommodated on a small printed circuit board in a housing including internal connections from the printed circuit board to a base with plugs. Such an arrangement, however, not only requires complicated assembly work and occupies a substantially larger volume than the relay alone, it is also unfavorable for switching higher currents because of long conduction paths via the printed circuit board to the base.

SUMMARY OF THE INVENTION

It is, therefore, an object of the present invention to convert a solder-installed-type relay into a pluggable arrangement which is optimally simple to assemble and which has optimally small dimensions. Particular embodiments are desired having plug terminals for carrying high currents and having a high overall strength and stability. The arrangement also desirably handles high plugging forces.

With an arrangement of a relay and an adaptor of the species initially cited, the objects are inventively achieved in that the male terminal lugs of the adaptor are fashioned as flat plugs or blades. A circumferential wall surrounds an interspace between a floor side of the relay, the base, and an exit region where the adaptor blades extend from an underside of the base. At least the exit region is filled with a casting compound.

By contrast to the adaptor arrangement disclosed in German patent document DE 28 10 511 C2, the present invention includes pluggable connector members, preferably blade-type plugs, at the outset in the inventive arrangement, i.e., a type known as "fast-on" or "quick-connect" plugs. These blades are rigid, having a suitably sized material cross section to accommodate occurring plugging forces and high currents. The base is surrounded by the circumferential wall at its upper side facing toward the relay and at its underside. Thereby, the exit region of the adaptor blades of the male connector member, whose conductor segments may be anchored in the base by plugging or by embedding, is not only sealed by an additional casting but is also reinforced and stabilized. The entire adaptor arrangement, with the relay soldered in or welded in non-positive fit, yields a single component that can be easily handled and installed and is also suitable for employments with high plugging forces.

The circumferential wall can be integrally formed in the base, so that the wall is respectively fashioned trough-shaped, extending both toward the upper side as well as toward the underside of the base. In this case, it is advantageous that an upper edge of the circumferential wall overlaps the lower edge of a housing cap of the relay. The interspace between relay and base including the overlap gap can thereby be filled with casting compound, whereby the entire arrangement is lent additional stability. In this case, the relay itself must already have been previously closed to such an extent that the casting compound cannot run into the inside of the relay.

In another embodiment, it is possible to fashion the circumferential wall at the base as an extension of a relay cap, so that the gap between the lengthened relay cap and the base is also sealed by casting out the underside of the base. The spacing between relay and base is thereby automatically co-sealed; however, it can also be additionally filled with casting compound in this case for stabilization.

In an embodiment of the invention, the adaptor blades project perpendicularly downward from the underside of the base, so that this underside also forms the plug terminal side of the overall arrangement. However, in another embodiment, the flat plugs may extend upwardly from their exit point of the base, i.e., at the underside or at the circumferential side of the base, proceeding vertically upward to the base plane so that the flat plugs extend along one or more outer sides of the relay and beyond the upper side of the relay. As a result, the relay's upper side then becomes the plug terminal side of the overall arrangement. Thereby, when installed, the relay stands upside-down. It is expedient in this case that the adaptor blades are fixed at the outside of the relay by a frame-shaped collar that is pressed thereover and which also insulates the outside. This collar can then further form the circumferential wall for the base and a trough-shaped receptacle space for the casting compound.

An advantageous method for manufacturing the inventive arrangement is also provided. In accordance with this aspect of the invention, the pressed male connector member is provided in unitary form, having pre-shaped conductor segments interconnected via intermediate webs and likewise having pre-shaped flat adaptor blades. The male connector member is pre-fixed in the insulating base by plugging or embedding. The intermediate webs are then cut out between the conductor segments to form independent conductive paths among the respective blades and conductor segments. Further, a relay with terminal pins is placed onto the base and the terminal pins are connected to the conductor segments with non-positive fit, preferably by soldering. Finally, a cavity defined by the circumferential wall in the region of the base is filled with casting compound. Instead of a one-piece or two-piece pressed screen having intermediate webs, it is also possible to embed conductor segments that were already previously separated into the base material. This, however, would require additional outlay for holding the individual parts in the injection mold. However, this type of embedding would have the advantage that no separating steps for removing the intermediate webs would be required at the finished base and that the finished base would have no other clearances other than the contact recesses. This would be advantageous when, for example, the relay were itself not closed at its underside so that the casting compound would be prevented from flowing into the interspace and into the relay.

Additional features and advantages of the present invention are described in, and will be apparent from, the Detailed Description of the Presently Preferred Embodiments, and from the drawings.

BRIEF DESCRIPTION OF THE DRAWINGS

The invention shall be set forth in greater detail below with reference to exemplary embodiments on the basis of the drawing. Shown are.

DETAILED DESCRIPTION OF THE PRESENTLY PREFERRED EMBODIMENTS

Figure 1:
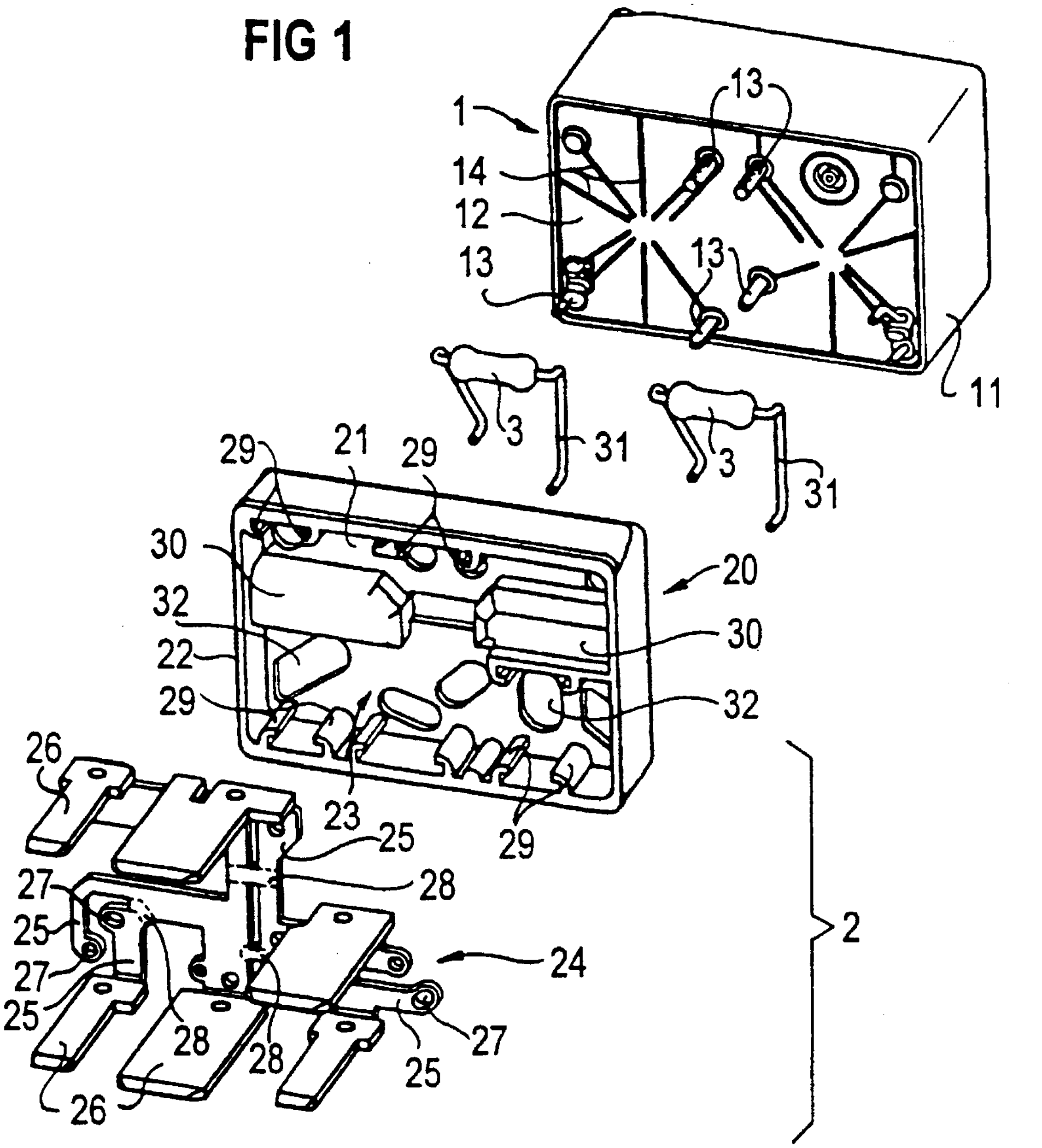
FIG. 1 illustrates a first embodiment of an inventive arrangement of a relay and of an adaptor with the individual parts before the assembly, shown in a perspective view.

The arrangement shown in FIGS. 1–4 includes a relay 1 as well as plug adaptor 2 that are connected to one another. The relay I has a housing with a housing cap 11 plugged on from above and also has a bottom plate 12 that forms the floor side of the relay and through which the solder terminal pins 13 emerge perpendicularly downward. The bottom side of the relay is sealed with casting resin via a channel or rib system 14.

The adaptor 2 comprises an insulative base 20 with a base plate 21. In the embodiment of FIGS. 1–4, a circumferential wall 22 is formed in the base 20 that proceeds all around and projects upwardly and downwardly. The circumferential wall 22 thus forms a cavity 23 open toward the underside into which a pressed screen or male connector member 24 having a plurality of prefabricated conductor segments 25 and flat adaptor blades 26 bent downwardly off is plugged. Each conductor segment 25 has at least one solder recess 27 for the plugging and soldering of a terminal pin 13 of the relay 1 or of an additional component. Each conductor segment 25 is also integrally connected to a flat blade 26. These blades 26 can have various widths depending on whether they are required for carrying load current or only for carrying a lower coil current.

Given the condition of assembly shown in FIG. 1, conductor segments are connected via intermediate webs 28 to form the unitary pressed male connector member 24 which is thus plugged into the base 20 as a discrete part. The flat plugs 26 are thereby respectively plugged into pockets in the base having. retainer ribs 29 which grasp the blades at both sides, pre-fixing them. The base 20 also preferably has one or more chambers 30 open toward the upper side for the acceptance of additional components such as, for example, resistors 3 serving as spark arrestors for the relay coil.

Figure 2:
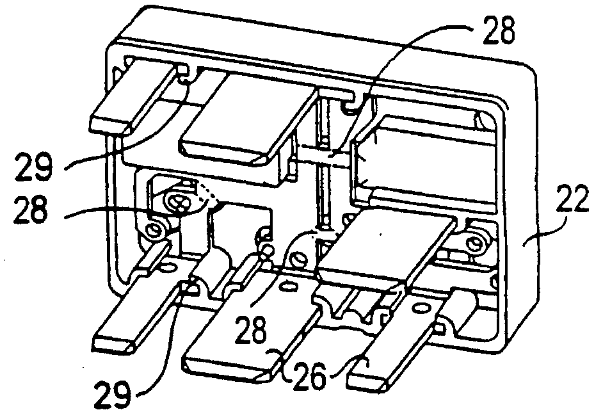
FIGS. 2 and 3 illustrate a pre-assembled adaptor of FIG. 1, shown in two perspective views.

During assembly, the base 20 is first equipped with the as yet single-piece male connector member 24, wherein the blades 26 are pre-fixed at said retainer ribs 29, as described. FIG. 2 illustrates this condition is shown in a perspective view from below. After the fixing of the individual blades, the intermediate webs 28 can be cut out, separating the conductor segments. Recesses 32 are provided in the base plate 21 in order to make these intermediate webs 28 accessible for a tool die.

Figure 3:
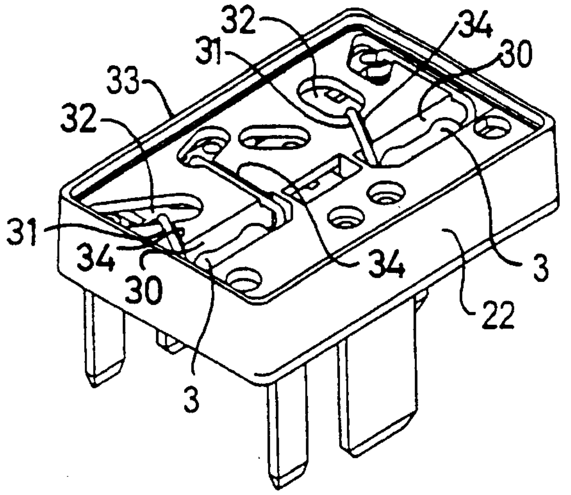

The base 20 may then be equipped with resistors 3 which are positioned into the chambers 30, their terminal wires being plugged into associated solder recesses 27 via depressions 34. A base equipped in this way is shown in FIG. 3. The relay 1 is then placed onto this base from above, whereby the relay terminal pins 13 are plugged into corresponding solder recesses 27 of the appertaining conductor segments. These terminal pins 13 and the terminal wires 31 are then soft-soldered to their conductor segments.

The cavity 23 formed at the underside of the base is then filled with a casting compound. This casting compound also penetrates into an interspace between the bottom plate 12 of the relay and the base. Since the upper edge 33 of the circumferential wall 22 of the base engages the housing cap 11 when the relay is plugged on, the gap formed between these two parts is likewise sealed by the casting compound. The upwardly open chambers 30 are not filled with casting compound or are only partially filled with casting compound during this procedure since the air cannot escape. This prevents the resistors 3 from being completely embedded and being exposed to undesired voltages.

Figure 4:
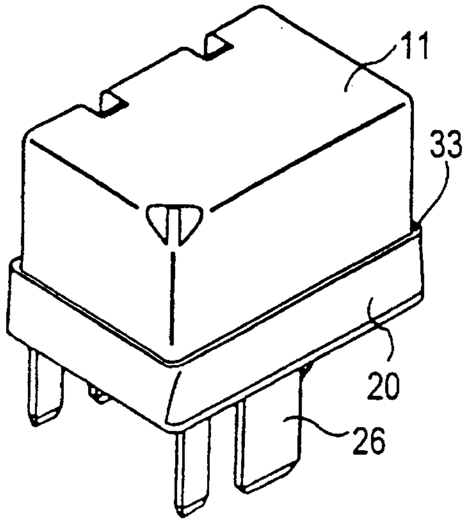
FIG. 4 illustrates the arrangement of FIG. 1 in its completely assembled form.

By this process, the arrangement forms an inherently stable new component, as shown in FIG. 4. In particular, the flat plugs are stabilized in the base by casting the cavity 23 out at the underside of the base such that they are also capable of absorbing high plugging forces.

Figure 5:
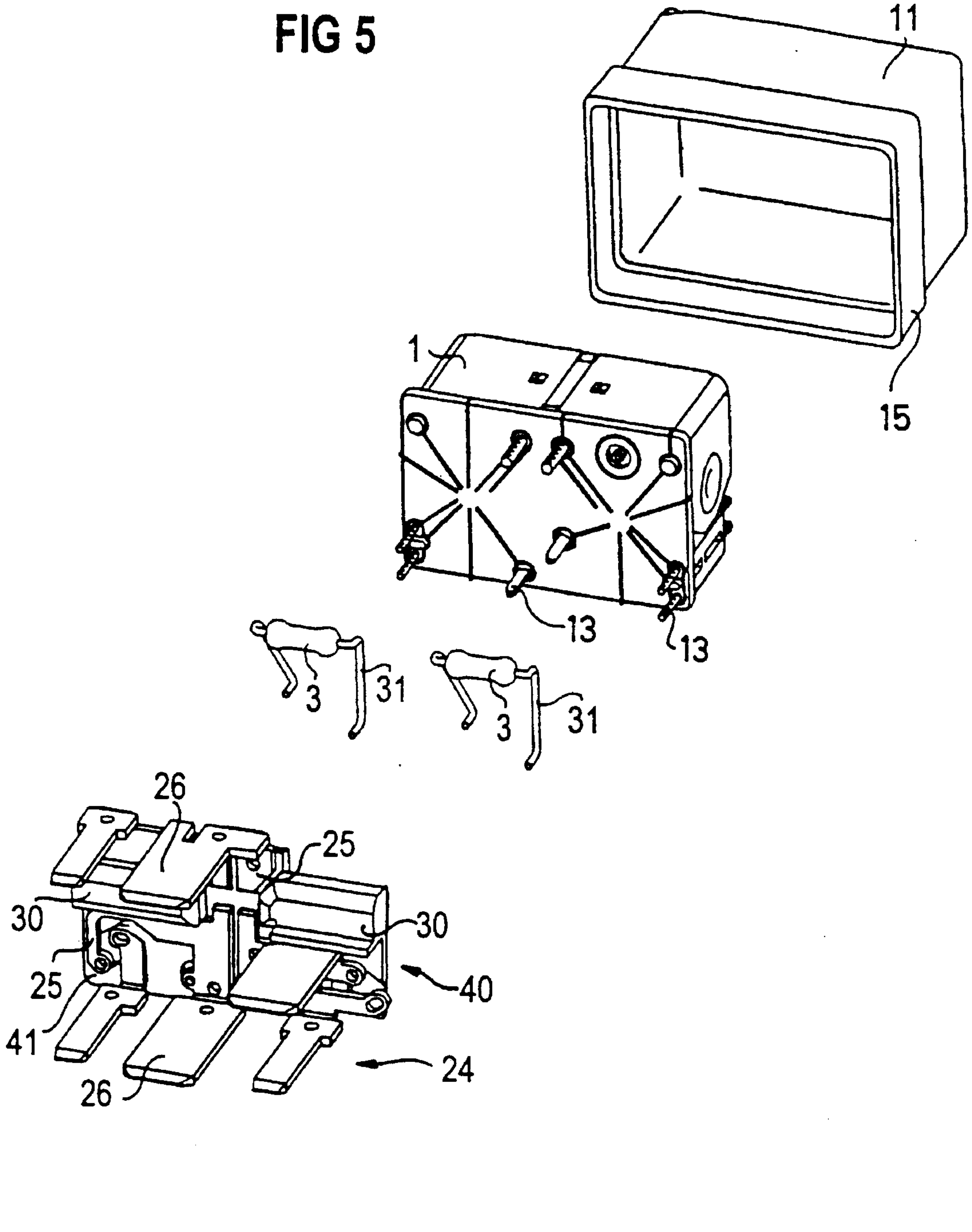
FIG. 5 illustrates a second embodiment of a relay with an adaptor in individual parts before assembly, shown in a prospective view.
Figure 6:
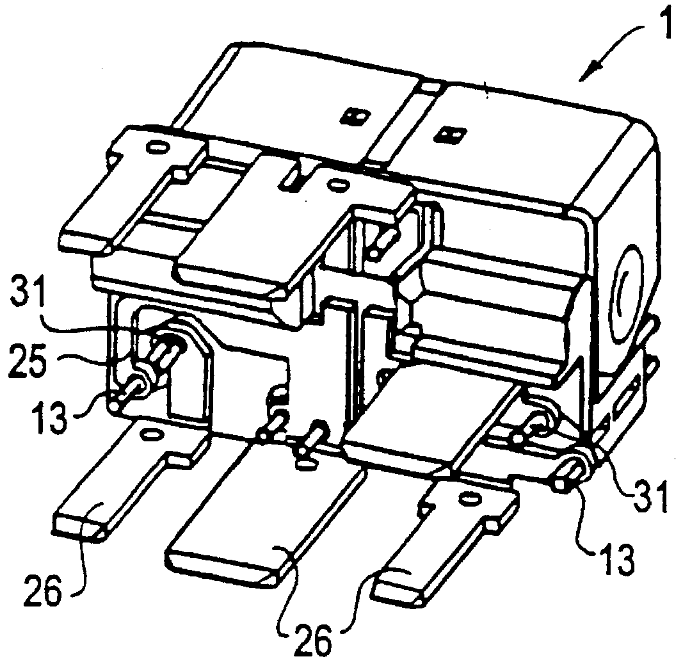
FIG. 6 illustrates the adaptor of FIG. 5 in the pre-assembled condition at the relay without cap.

FIGS. 5 and 6 show a somewhat modified exemplary embodiment. The relay 1 is thereby shown without the housing cap 11 and is only equipped with its bottom plate 12. The housing cap 11 of the relay also comprises a downward extension in the form of a collar 15.

In this exemplary embodiment of FIGS. 5 and 6, the base 40 is formed only by a base plate 41 without a circumferential wall, namely by an extrusion-coating of a male connector member 24 formed with pre-shaped conductor segments 25 and blades 26 just as in the embodiment described in connection with FIGS. 1–4. This male connector member 24 may be first extrusion-coated with. plastic during assembly in order to acquire the edgeless base 40. After the extrusion-coating, the plate segments are insulated from one another by cutting out the intermediate webs 28, as in the preceding example. FIG. 5 shows this condition. For the rest, the base plate 41 is constructed in exactly the same way as the base plate 21 previously set forth, for example also having chambers 30 for the acceptance of the resistors 3. After being equipped with these resistors 3, the relay 1 is placed without a cap onto the base 40 and, as previously, the terminal pins 13 and the terminal wires 31 are soldered. FIG. 6 shows this condition. The housing cap 11 is then plugged over the relay with the base according to FIG. 6, whereby the collar 15 surrounds the base and in turn forms a cavity at the underside thereof that is filled with casting compound.

Figure 7:
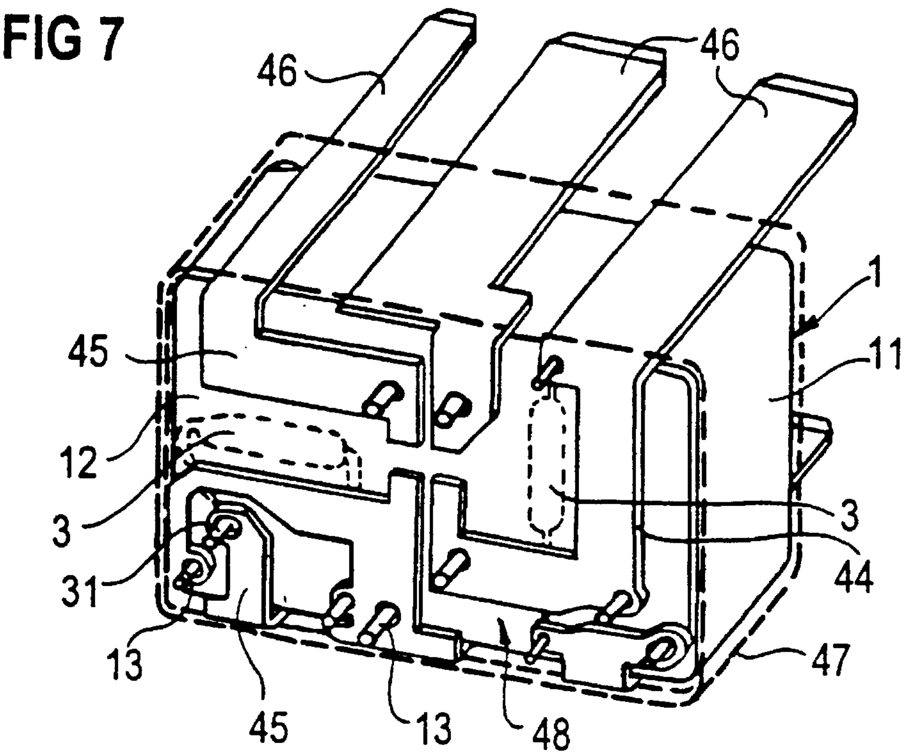
FIG. 7 illustrates a third embodiment of an inventive relay-adaptor arrangement.

FIG. 7 shows a further embodiment. A relay 1, which is closed with a housing cap and a bottom plate as in FIG. 1, is connected to an adaptor composed of a base plate (not shown) and a pressed male connector member 44. The base plate is essentially fashioned like the base plate 41 in FIG. 5, whereby the male connector member is preferably embedded. The individual conductor segments 45 are thereby preferably cut free after being embedded, as likewise set forth with reference to FIG. 5. However, a previous cutting and embedding of the individual parts is also possible. By contrast to the preceding exemplary embodiments, the blades 46 connected to the conductor segments 45 here do not extend perpendicularly downward from the bottom side, but rather are bent off perpendicularly from the bottom side to extend upwardly along the outer sides of the relay 1.

During manufacture and assembly, thus, the pressed male connector member 44 is embedded into the material of the base plate, without projection at the floor side insofar as possible. After the conductor segments have been cut free, resistors 3 or other components may be positioned in chambers of the base plate as in the preceding exemplary embodiments and the relay 1 is placed thereon. In the example of FIG. 7, a frame-shaped collar 47 (indicated with broken lines) is slipped over the blades lying laterally against the housing cap 11, namely only up to the underside of the relay. In this way, the terminal pins 13 and the terminal wires 31 in the recesses of the conductor segments are easily accessible, so that, for example, soldering can then be undertaken by emersion in a solder bath. Subsequently, the collar 47 is pushed to project toward the underside of the adaptor, so that the solder locations lie in a cavity 48 surrounded by the collar edge. This cavity 48 is then filled with casting compound as in the preceding exemplary embodiments. As previously, the interspaces and gaps between the relay 1, the base plate (not shown) and the collar 47 are also glued and sealed. Of course, it would also be possible to slip a cap closed at one side on proceeding from the upper side of the relay (with appropriate clearances for the flat plugs) or from the underside of the adaptor instead of the collar 47 and to cast this out.

It should be understood that various changes and modifications will be apparent to those skilled in the art. For example, the invention is not limited to a specific type of contacting the relay terminal pins. Also, although a solder connection is respectively set forth in the examples, this could also be replaced, for example, by a careful welding process. Moreover, the adaptor blades may be any shape so long as they have the structural integrity required for withstanding plugging forces and the subject currents. Such changes and modifications may be made without departing from the spirit and scope of the present invention and without diminishing its attendant advantages. Therefore, the appended claims are intended to cover such changes and modifications.

What is claimed is:

1. An arrangement comprising:

a relay with terminal pins projecting from a lower side of the relay;

a plug adaptor connectable to the lower side of the relay, the adaptor including:

an insulating base;

a male connector member secured to the insulating base, the member having a plurality of conductor segments lying generally in a plane parallel to the lower side, each conductor segment respectively forming a solder recess for non-positive fit contacting of a respective one of the terminal pins, the male connector member also having a plurality of blades bent off from the conductor segments perpendicularly relative to the lower side, the blades extending from the base at an exit region; and a circumferential wall surrounding an interspace defined between the lower side of the relay and the base as well as the exit region of the blades from an underside of the base;

wherein at least the exit region is filled with casting compound.

2. The arrangement according to claim 1, wherein the conductor segments are respectively secured in the base by a plug-in engagement, and wherein the conductor segments are fixed and stabilized by the casting compound.

3. The arrangement according to claim 2, wherein the male connector member is secured into a plurality of retainer ribs formed in an underside of the base.

4. The arrangement according to claim 1, wherein the conductor segments are partially embedded into the insulating base.

5. The arrangement according to claim 1, wherein the circumferential wall is formed in the base.

6. The arrangement according to claim 5, further comprising a housing cap covering the relay, and wherein at least part of the circumferential wall overlaps the housing cap at an upper side of the base.

7. The arrangement according to claim 1, further comprising a housing cap covering the relay, the housing cap having an integral collar forming the circumferential wall.

8. The arrangement according to claim 1, further comprising at least one additional component arranged in the base, each component being connected to the conductor segments via terminal wires.

9. The arrangement according to claim 8, wherein the terminal wires are soldered to the conductor segments.

10. The arrangement according to claim 8, wherein the base further includes at least one chamber formed therein for accommodating the component.

11. The arrangement according to claim 1, wherein each blade is respectively bent perpendicularly up from the base plane and extends along the outside of the relay to a point above the relay upper side, so that the relay's upper side forms a plug terminal side of the arrangement.

12. The arrangement according to claim 11, further comprising a frame-shaped collar fitting over the relay, wherein the upwardly-bent blades are surrounded by the frame-shaped collar at least in a region near the base, said collar forming the circumferential wall in a region near base and forming a trough-shaped sealing region filled with the casting compound at the floor side of the base.

13. The arrangement according to claim 1 wherein the non-positive contacting of the terminal pins to the contact segments is a soldered connection.

14. A method for manufacturing a relay and adaptor arrangement, the method comprising:

providing a male connector member having a plurality of prefabricated conductor segments and a plurality of prefabricated flat plugs;

providing an insulative base;

securing the male connector member to the base;

placing the relay onto the base and connecting terminal pins of the relay with non-positive fit to the conductor segments; and filling a cavity formed in the base with a casting compound, the cavity being surrounded by a circumferential wall.

15. The method according to claim 14, wherein the male connector member is provided as a unitary component such that the conductor segments are interconnected via intermediate webs, the method further comprising:

cutting out the intermediate webs after securing the male connector member to the base.

16. The method according to claim 14, whereby the securing of the integral screen includes plugging portions of the screen into between prefabricated ribs of the base.

17. The method according to claim 14, whereby the securing of the integral screen includes partially embedding the screen into the insulating material of the base.

18. The method according to claim 14, wherein the base forms the circumferential wall, the method further comprising:

fitting a housing cap over the relay, such that the circumferential wall fits in overlapping fashion over the lower edge of the housing cap; and sealing a gap defined between the circumferential wall and the housing cap by said step of filling the cavity.

19. The method according to claim 14, whereby the relay is connected to the base in an uncovered condition, the method further comprising:

plugging housing cap onto the arrangement, the housing cap having a height such that it surrounds the relay, the housing cap having a collar forming the circumferential wall, the circumferential wall and the base cooperatively defining the cavity filled with casting compound.

20. The method according to claim 14, wherein the relay is surrounded with a housing cap, and wherein said base generally lies in a base plane parallel to a lower side of the relay, wherein said blades project perpendicularly upwardly from the base plane and extend along the outside of the relay to a point above the relay upper side so that the upper side forms a plug terminal side of the arrangement, the method further comprising:

securing the blades at the circumference of the relay by slipping a frame-shaped collar over circumferentially around the blades, the cavity being cooperatively defined by the collar and the base.

21. The method according to claim 20, whereby the collar is slipped on only up to the underside of the relay before the non-positive fit connection of the terminal pins and is slipped in projecting fashion to the underside of the base after the connecting procedure in order to form the trough-shaped cavity for the acceptance of the casting compound.

22. The method according to claim 14 wherein said connecting of the terminal pins of the relay with non-positive fit to the conductor segments includes soldering.

* * * * *